United States Patent [19]
Dent

[11] Patent Number: 5,930,128
[45] Date of Patent: Jul. 27, 1999

[54] POWER WAVEFORM SYNTHESIS USING BILATERAL DEVICES

[75] Inventor: Paul Wilkinson Dent, Pittsboro, N.C.

[73] Assignee: Ericsson Inc., Research Triangle Park, N.C.

[21] Appl. No.: 09/054,060

[22] Filed: Apr. 2, 1998

[51] Int. Cl.[6] .............................. H02M 1/12; H02J 1/00
[52] U.S. Cl. .............................. 363/43; 307/80; 307/82; 330/124 R
[58] Field of Search ................... 363/43, 49, 72, 363/17; 323/271, 272; 375/261; 307/82, 80, 71, 60; 330/124 R

[56] References Cited

U.S. PATENT DOCUMENTS

| | | | |
|---|---|---|---|
| 2,210,028 | 8/1940 | Doherty . | |
| 3,448,366 | 6/1969 | Goff | 363/43 |
| 4,791,815 | 12/1988 | Yamaguchi et al. | 73/1.37 |
| 5,420,541 | 5/1995 | Upton et al. | 330/286 |
| 5,483,433 | 1/1996 | Yang | 363/43 |
| 5,568,088 | 10/1996 | Dent et al. | 330/151 |
| 5,574,967 | 11/1996 | Dent et al. | 455/12.1 |
| 5,631,604 | 5/1997 | Dent et al. | 330/124 R |
| 5,638,024 | 6/1997 | Dent et al. | 330/84 |
| 5,682,303 | 10/1997 | Goad | 363/71 |
| 5,815,531 | 9/1998 | Dent | 375/298 |

OTHER PUBLICATIONS

Chireix, "High Power Outphasing Modulation," Proceedings of the Institute of Radio Engineers, vol. 23, No. 11, Nov. 1935, pp. 1370–1392.

*Primary Examiner*—Peter S. Wong
*Assistant Examiner*—Rajnikant B. Patel
*Attorney, Agent, or Firm*—Myers Bigel Sibley & Sajovec

[57] ABSTRACT

Waveform synthesizers represent an input waveform as a sequence of numerical codes in a number base, each numerical code comprising a plurality of digits ordered by place significance. A plurality of bilateral amplifiers is provided, a respective one of which is associated with a respective one of the digits. The bilateral amplifiers consume current from the DC power supply and return current to the DC power supply based on the value of the associated digit, to thereby generate an output voltage level that is proportional to the value of the associated digit. The output voltage levels of the plurality of bilateral amplifiers are serially coupled to the load, with a weighting that is based upon the place significance of the associated digit. Waveform synthesizers that are so constructed are capable of theoretical efficiencies of 100% for any signal waveform. These waveform synthesizers may be used efficiently to amplify to a transmit power level or radio signal that varies in amplitude as well as phase. These waveform synthesizers may also be used as a DC-to-AC converter having a sinusoidal output waveform.

20 Claims, 5 Drawing Sheets

POWER WAVEFORM SYNTHESIS USING BILATERAL DEVICES

CROSS REFERENCE TO RELATED APPLICATION

This invention is related to application Ser. No. 09/054,063, filed Apr. 4, 1998, entitled "Hybrid Chireix/Doherty Amplifiers and Methods", (Attorney Docket 8194-140) assigned to the assignee of the present invention, the disclosure of which is hereby incorporated herein by reference.

FIELD OF THE INVENTION

This invention relates to waveform synthesizing systems and methods, and more particularly to waveform synthesizing systems and methods that are capable of high efficiency.

BACKGROUND OF THE INVENTION

Waveform synthesizing systems and methods are widely used in electronic systems such as communication systems. A synthesizing apparatus synthesizes from an input waveform, an output waveform in a load using a DC power supply. When the input waveform is an AC input waveform, the synthesizing apparatus may be regarded as an amplifier. When the input waveform is a DC input waveform, the synthesizing apparatus may be regarded as a DC-to-AC power converter. Synthesizing apparatus are widely used as power amplifiers in audio-video systems, instrumentation and in radio frequency communication systems. In radio frequency communication systems, synthesizing apparatus are widely used in transmitters of base stations and transmitters of mobile radiotelephones.

A major consideration in the design of power amplifiers is the efficiency thereof. High efficiency is generally desirable so as to reduce the amount of power that is dissipated as heat. Moreover, in many applications, such as in satellites and portable radiotelephones, the amount of power that is available may be limited. An increase in efficiency in the power amplifier is therefore important, in order to allow an increase the operational time or capacity for the satellite or portable radiotelephone.

Conventional DC-to-AC power converters include square wave inverters, modified sinewave inverters and true sinewave inverters. Square wave inverters convert DC-to-AC power, but their square-wave output signal waveform may contain large amounts of odd harmonic energy. Certain electronic devices do not operate efficiently when large harmonic content is present in the output waveform. For example, radio or audio interference may occur when attempting to power a radio or TV set from such an inverter. An additional problem with square wave inverters is that the peak and rms values of the waveform generally do not have the same ratio of $\sqrt{2}$ as in a conventional sinewave supply. Certain loads, such as lamps, only require that the RMS value of a power source should be correct. However, other loads including transformer-rectifier arrangements, may operate correctly only if the peak voltage level is correct. Therefore, all loads may not operate correctly from a square waveform.

The above problems may be partly overcome by using a modified sinewave inverter. A modified sinewave inverter is generally a modified square wave inverter, modified to produce a 3-level output waveform of levels+Vpeak, 0, −Vpeak, 0 . . . in repetitive sequence. Introduction of the 0-level for a properly chosen proportion of the time allows the waveform to have the same peak-to-rms ratio as a sinewave, thus extending the range of apparatus designed for sinewave operation that can be correctly powered by the inverter. However, the odd harmonic content of the waveform may increase in this case, and loads such as motors that are less efficient when large harmonic content is present may still not function efficiently. Thus, there was still a need in the prior art for "true sinewave" inverters.

A true sinewave inverter can be made using a class-B linear amplifier to amplify a sinewave signal to a high power level. However, such an amplifier may achieve a maximum DC-to-AC power conversion efficiency of $\pi/4$ or 78.5% even using ideal components. Another prior art means to produce a true sinewave inverter comprises using square-wave switching devices in conjunction with inductor-capacitor filtering to remove harmonics, thereby converting the square switching waveform to a sinusoidal output waveform. However, inverters based on filtering may require very large filtering components and may suffer from poor voltage regulation when loaded by different amounts.

Other prior art true sinewave inverters have been reported in which several square-wave inverters operating at, for example the line frequency, 3× the line frequency, 5× the line frequency, etc. have their outputs combined such that the odd harmonic content cancels. Such converters can achieve high efficiency but may be limited in the accuracy of the waveform. They are also generally adapted to convert DC-to-AC power only for a particular waveform, and not for a general waveform such as an audio or radio signal.

It is also known to use a digital-to-analog (D/A) converter as a waveform synthesizer, where the input waveform is a digital waveform. A well known type of D/A converter is a weighted-resistor D/A converter. The weighted resistor D/A converter uses resistor values that are weighted, so that their resistances are inversely proportional to the numerical significance of the corresponding binary digit. The resistors are coupled to a load by a corresponding plurality of switches. The switches may be field effect transistors or complementary bipolar transistors. See pages 494–516 of *"Digital Integrated Electronics"* by Taub and Schilling, 1977.

Notwithstanding all of the above approaches, there continues to be a need for waveform synthesizers that can synthesize waveforms at high efficiency.

SUMMARY OF THE INVENTION

It is therefore an object of the present invention to provide improved waveform synthesizing apparatus and methods.

It is another object of the present invention to provide waveform synthesizing apparatus and methods that are capable of synthesizing from an input waveform, an output waveform in a load using a DC power supply, at high efficiency.

These and other objects are provided according to the invention, by waveform synthesizers that represent an input waveform as a sequence of numerical codes in a number base, each numerical code comprising a plurality of digits ordered by place significance. A plurality of bilateral amplifiers is provided, a respective one of which is associated with a respective one of the digits. The bilateral amplifiers consume current from the DC power supply and return current to the DC power supply based on the value of the associated digit, to thereby generate an output voltage level that is proportional to the value of the associated digit. The output voltage levels of the plurality of bilateral amplifiers are serially coupled to the load, with a weighting that is based upon the place significance of the associated digit. Waveform synthesizers that are so constructed are capable of theoretical efficiencies of 100% for any signal waveform. These waveform synthesizers may be used efficiently to amplify to a transmit power level a radio signal that varies in amplitude as well as phase. These waveform synthesizers may also be used as a DC-to-AC converter having a sinusoidal output waveform.

In a preferred embodiment of the present invention, the output voltage levels of the plurality of bilateral amplifiers are serially coupled to the load using a plurality of transformers, each having a primary and a secondary. A respective primary is coupled to a respective one of the bilateral amplifiers. The secondaries are serially coupled to the load. The primary-to-secondary turns ratios of the plurality of transformers are proportional to the place significance of the associated digit.

As described above, the present invention preferably uses bilateral amplifiers. The bilateral amplifiers may use field effect transistors that conduct bilaterally from source-to-drain and from drain-to-source. Alternatively, bipolar transistors including reverse conduction diodes may be used. These bipolar transistors conduct in a forward direction through the bipolar transistor and in a reverse direction through the reverse conduction diodes. Other bilateral amplifying devices may also be used.

The input waveform may be a DC input waveform to provide a DC-to-AC power converter, the output waveform of which is approximately sinusoidal. Alternatively, the input waveform may be an AC input waveform, to provide a power amplifier that is capable of high efficiency. A digital input waveform may also be used.

The present invention is not confined to base 2 input waveform representations. The number base may be binary, so that the plurality of bilateral amplifiers can comprise a plurality of square wave inverters. However, the number base may also be ternary, wherein the plurality of binary amplifiers comprise a plurality of square wave inverters with zero clamping, to generate positive, zero and negative output voltage levels.

According to yet another aspect of the present invention, at least one linear amplifier is also included that is associated with at least two of the least significant digits. The linear amplifier generates a linear output voltage that is proportional to the combined values of the at least two of the least significant digits. The linear output voltage is also serially coupled to the load along with the remaining bilateral amplifiers.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1A:
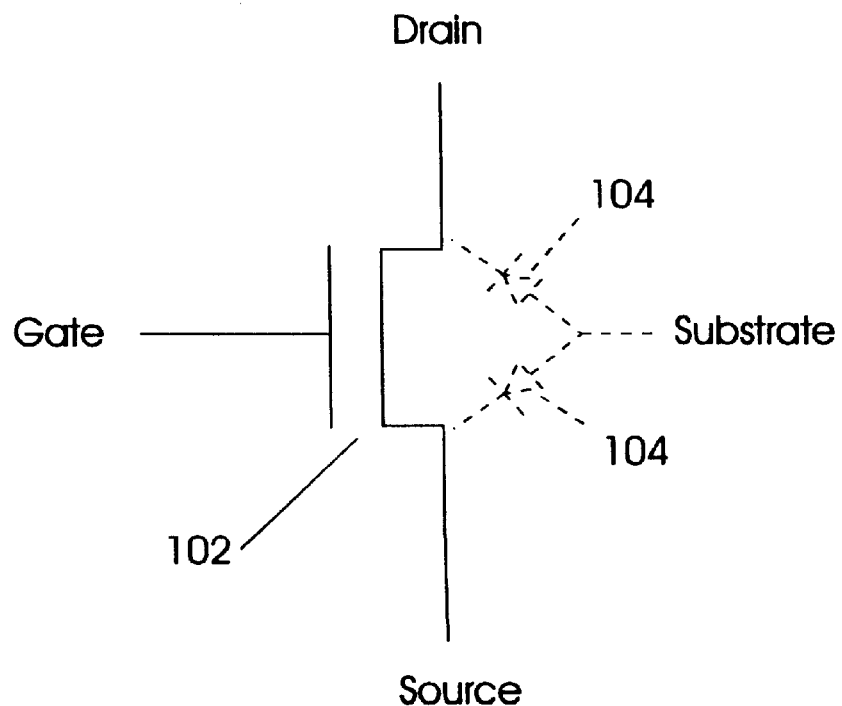
FIGS. 1a and 1b are circuit diagrams of bilateral devices that can be used with the present invention.
Figure 1B:
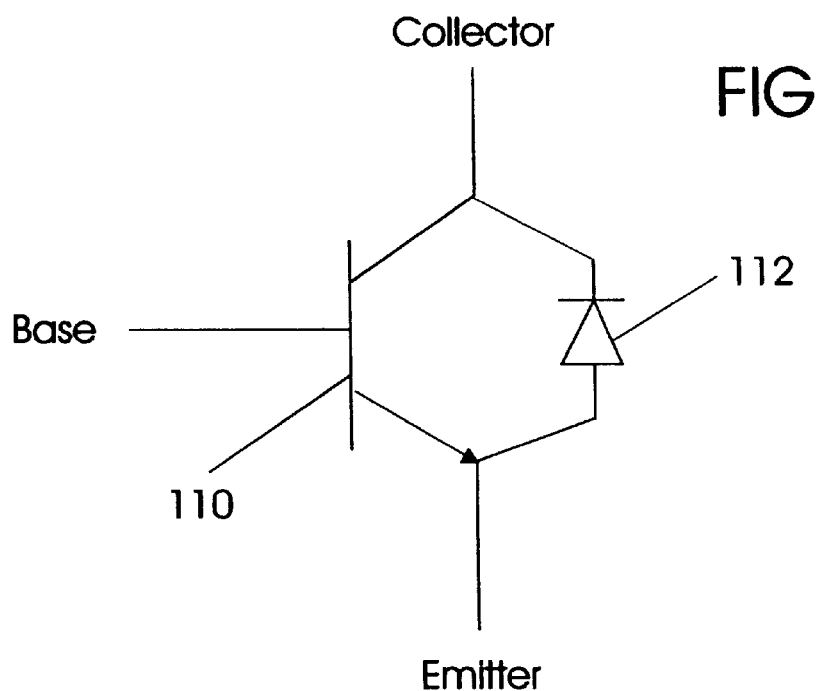

The present invention uses bilateral amplifier devices that can be turned on and off, and which can pass current in either direction when turned on. FIGS. 1a and 1b illustrate the circuit symbols of conventional bilateral devices that are suitable for use in the invention. FIG. 1a shows an N-type FET 102 including its incidental substrate diodes 104. The FET 102 becomes a low impedance to currents flowing from either drain to source or vice versa. By connecting substrate to source, the incidental drain-substrate diode also assists in reverse current flow from source to drain. However, this connection is not necessary with an FET.

FIG. 1b shows a bipolar transistor 110 with a reverse conduction diode 112 added externally. When current attempts to flow in the reverse direction in a bipolar transistor, reversing the roles of emitter and collector, the reverse current gain is generally much lower than the forward current gain, such that the control current supplied to the base may have to be increased excessively in order to support the reverse current. The use of an external reverse conduction diode 112 allows reverse current to flow through the diode without relying upon the transistor's reverse current gain.

Figure 2:
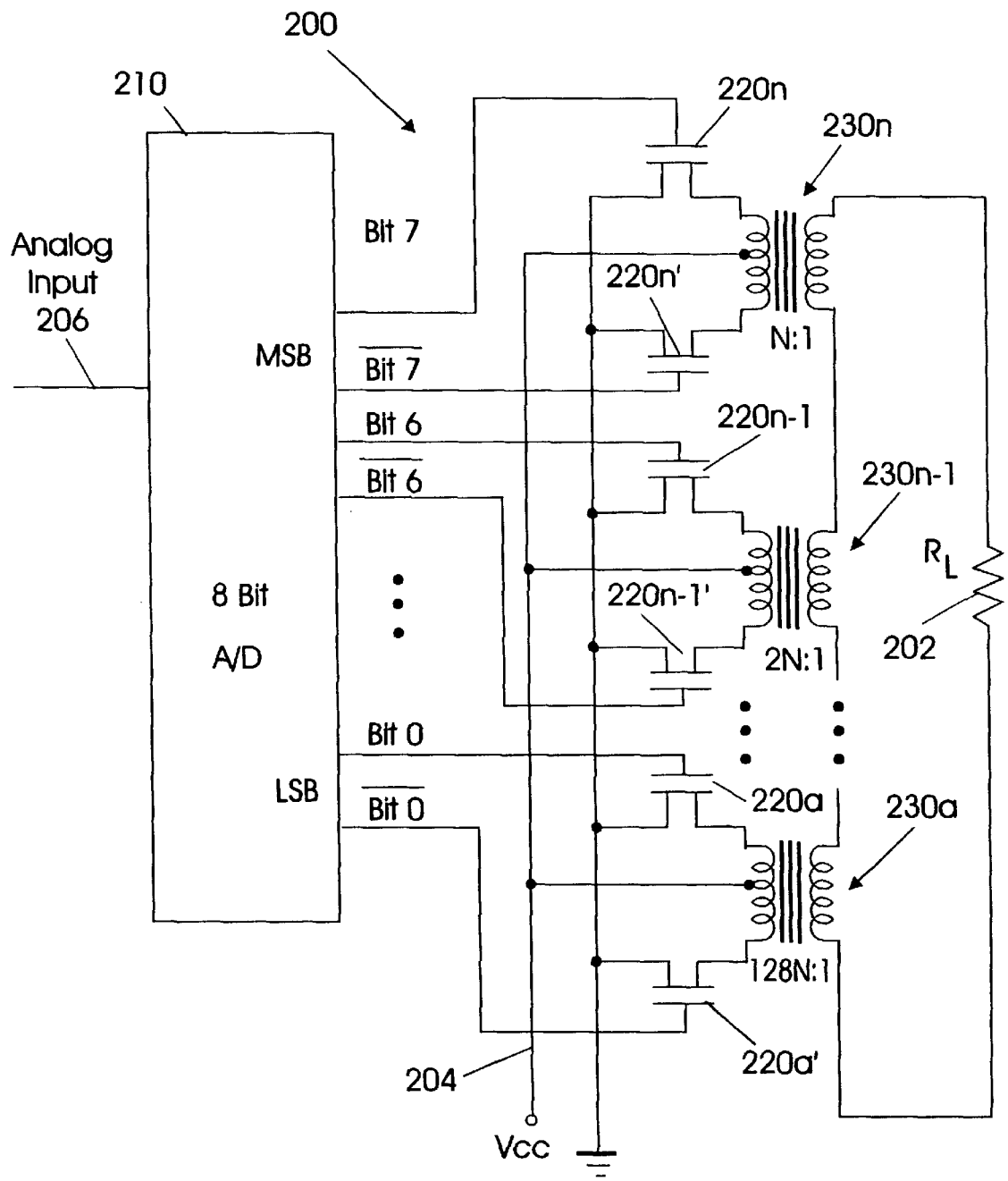
FIG. 2 is a circuit diagram of waveform synthesis by series connection of bit weighted, square wave inverters according to the invention.

Using any suitable bilateral device such as exemplified in FIGS. 1a and 1b, the invention may be constructed according to FIG. 2.

Referring to FIG. 2, a synthesizing apparatus 200 according to the present invention, synthesizes an output waveform in a load $R_L$ 202 using a DC power supply Vcc 204 from an input waveform 206. Synthesizing apparatus 200 includes means, such as an analog-to-digital (A to D) converter 210 for representing the input waveform 206 as a sequence of numerical codes in a number base. Each numerical code comprises a plurality of digits ordered by place significance. In FIG. 2, the representing means is a binary 8-bit analog-to-digital converter, so that the plurality of digits are bit 0–bit 7 and $\overline{\text{bit 0}}$–$\overline{\text{bit 7}}$, ordered by powers of two.

Still referring to FIG. 2, a plurality of bilateral amplifying means each includes a pair of bilateral devices 220a, 220a'–220n, 220n'. The bilateral amplifiers may comprise either of the bilateral devices shown in FIGS. 1a or 1b or any other bilateral device. Each bilateral device 220a, 220a'–220n, 220n' consumes current from the DC power supply Vcc 204 and returns current to the DC power supply based on the value of the associated digit, to thereby generate an output voltage level that is proportional to the value of the associated digit.

Finally, referring to FIG. 2, means is provided for serially coupling the output voltage levels of the plurality of bilateral amplifying means to the load $R_L$ 202 with a weighting that is based upon the place significance of the associated digit. As shown in FIG. 2, the serially coupling means preferably comprises a plurality of transformers 230a–230n. Each transformer has a primary and a secondary. The secondaries are serially coupled to the load 202. A respective one of the primaries is coupled to a respective one of the bilateral amplifying means 220. The primary-to-secondary turns ratios of the plurality of transformers 230a–230n are proportional to the place significance of the associated digit. It will be understood that the designation primary and secondary is arbitrary and may be reversed.

Additional description of waveform synthesizers of FIG. 2 will now be provided.

A signal waveform to be amplified to a high power level is fed to an 8-bit analog-to-digital (A/D) converter 210 to generate an 8-bit representation of the waveform at a plurality of sampling points in time. The sampling rate should conform to at least the Nyquist rate for the waveform of twice the maximum frequency obtained in the waveform. However, the sampling rate is preferably many times greater than the Nyquist rate to reduce the need for stringent filtering of the amplified signal to remove quantization noise. If the waveform is repetitive, as in a DC-to-AC power converter application, or comprises a limited number of variants, as in a radio transmitter for transmitting digital data, the numerical samples can be precomputed and stored in a memory, and the A/D converter 210 can then be omitted in favor of direct digital representation of an input waveform as a sequence of numerical codes.

The numerical samples are a binary coded representation of the instantaneous signal voltage having a most significant bit (MSB) that represents ±0.5, a next most significant bit that represents ±0.25, a third most significant bit that represents ±0.125, etc., down to the least significant bit (LSB) which, in the case of an 8-bit converter, represents ±1/256. When all the bits are of the same positive polarity, e.g. all binary 1s, the voltage represented is 0.5+0.25+0.125 . . . . +1/256=255/256 which is nearly +1. Conversely, when all the bits are of negative polarity, i.e. 00000000, the voltage represented is −0.5−0.25 . . . . −1/256=−255/256 which is nearly −1. These are normalized representations, relative to some maximum voltage. Scaling of the actual switched DC source voltage to an AC output voltage is effected with the aid of transformers 230a–230n.

The most significant bit, bit-7 is used to control a most significant inverter 220n–220n' connected to the load circuit via an N:1 transformer 230n. The value of the turns ratio N is chosen to be the reciprocal of the bit weight (1/0.5=2 for the most significant bit) times the ratio of the DC supply voltage to the desired peak AC output voltage. The turns ratio N thus successively doubles for bits of progressively lower bit weight as shown in FIG. 2 by the ratios N:1, 2N:1, 4N:1 . . . . 128N:1 for the transformers of successively lower significance.

Figure 3:
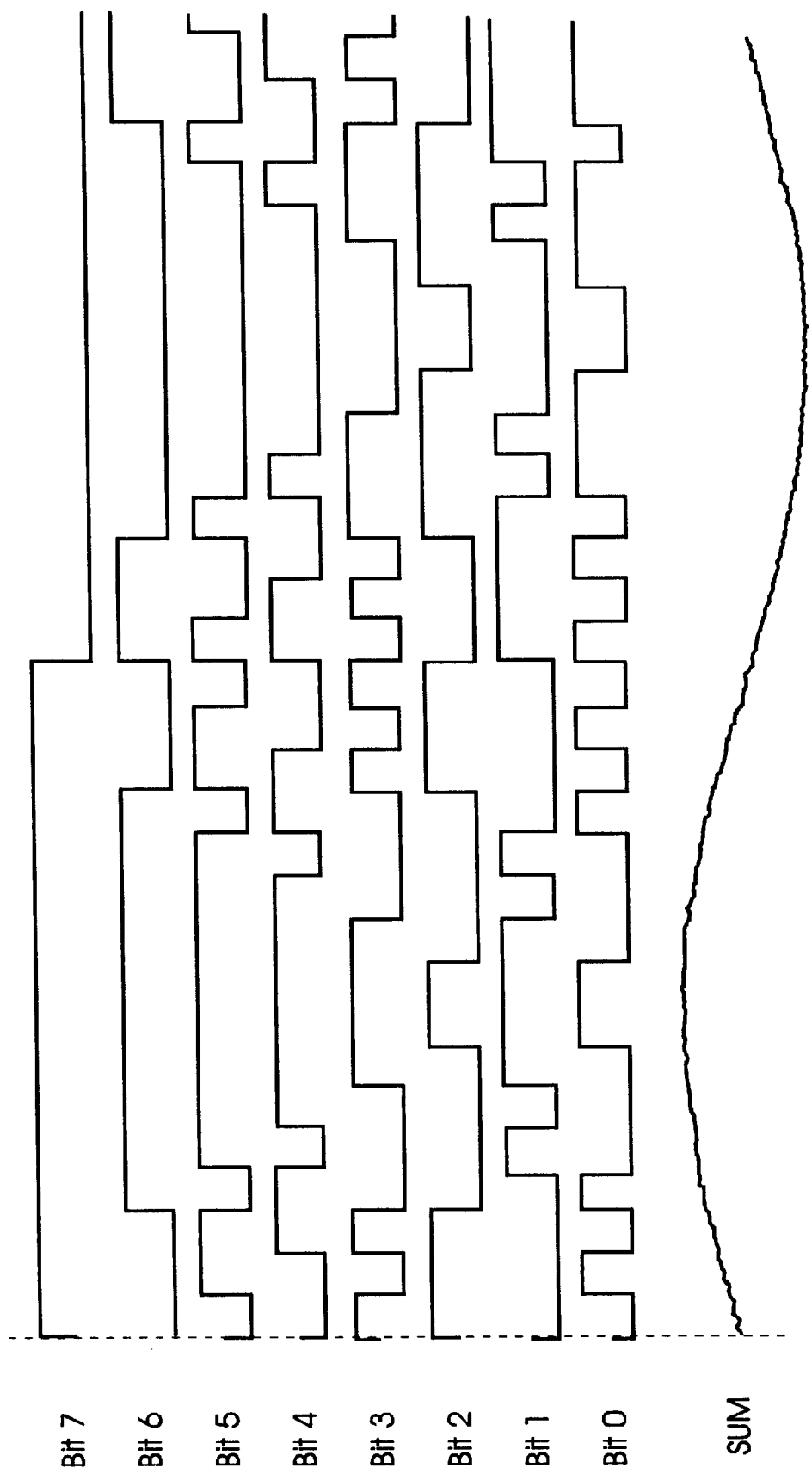
FIG. 3 graphically illustrates synthesis of a sinewave using 8-bit waveforms.

FIG. 3 shows the unfiltered output waveform and the waveforms of the individual bits when synthesizing a sinewave output using 32 time samples per cycle. In these waveforms, quadrential symmetry has been enforced by computing the 8-bit representations for the first 8 sample points and time-reversing them for the next 8. The second 16 samples are then given the code complementary to the first 16 samples. Each bit waveform thereby possesses±symmetry, so that it will pass through a transformer. The weighted sum of the bits, i.e. the load voltage, showing the purity of the synthesized sinewave, is also shown in FIG. 3, as SUM.

It may be seen that the most significant bit, which can be thought of as a sign bit, changes in a square-wave fashion at the fundamental frequency. The bits of lower significance, as well as being of progressively half the voltage significance, change at a faster rate. Thus, the amount of magnetic material or copper in the output transformers of lower significance may be reduced due to both the reduced voltage and power level they have to handle and also due to the higher alternation frequency.

It will be noted in FIG. 3 that, while the most significant bit is always positive during the first (positive) half cycle of the sinewave output, bits of lower significance are often negative, which means that their contribution is being subtracted from the net output voltage. The inverters associated with bits that are subtracting from the magnitude of the output voltage thus have an output current flow which is in the opposite direction to the output voltage. This means that the output device of that inverter which is in the ON state is not absorbing power from the DC supply, but is returning current to the DC supply by virtue of the bilateral inverter device conducting current in the reverse direction.

The operation of synthesizer 200 of FIG. 2 as an audio amplifier or medium frequency radio transmitter output stage is similar to its operation as a DC-AC power converter. The transformers should be properly designed to operate efficiently in the desired frequency range. Using the invention, very linear and efficient single-sideband (SSB) transmitters may be constructed, for example in the 1–30 MHz radio frequency range.

It is also possible to synthesize a sinusoidal output waveform based on a sampled and ternary coded representation. A ternary coded representation comprises, for each sample, a multi-digit code, the digits of which represent either +1, 0 or −1. Digits of lower significance then have one third the weight of digits of the next highest significance. Since $3^5$ is 243 and $2^8$ is 256, five ternary digits can represent approximately the same purity as an 8-bit version of the invention using only 5 ternary stages.

Figure 4:
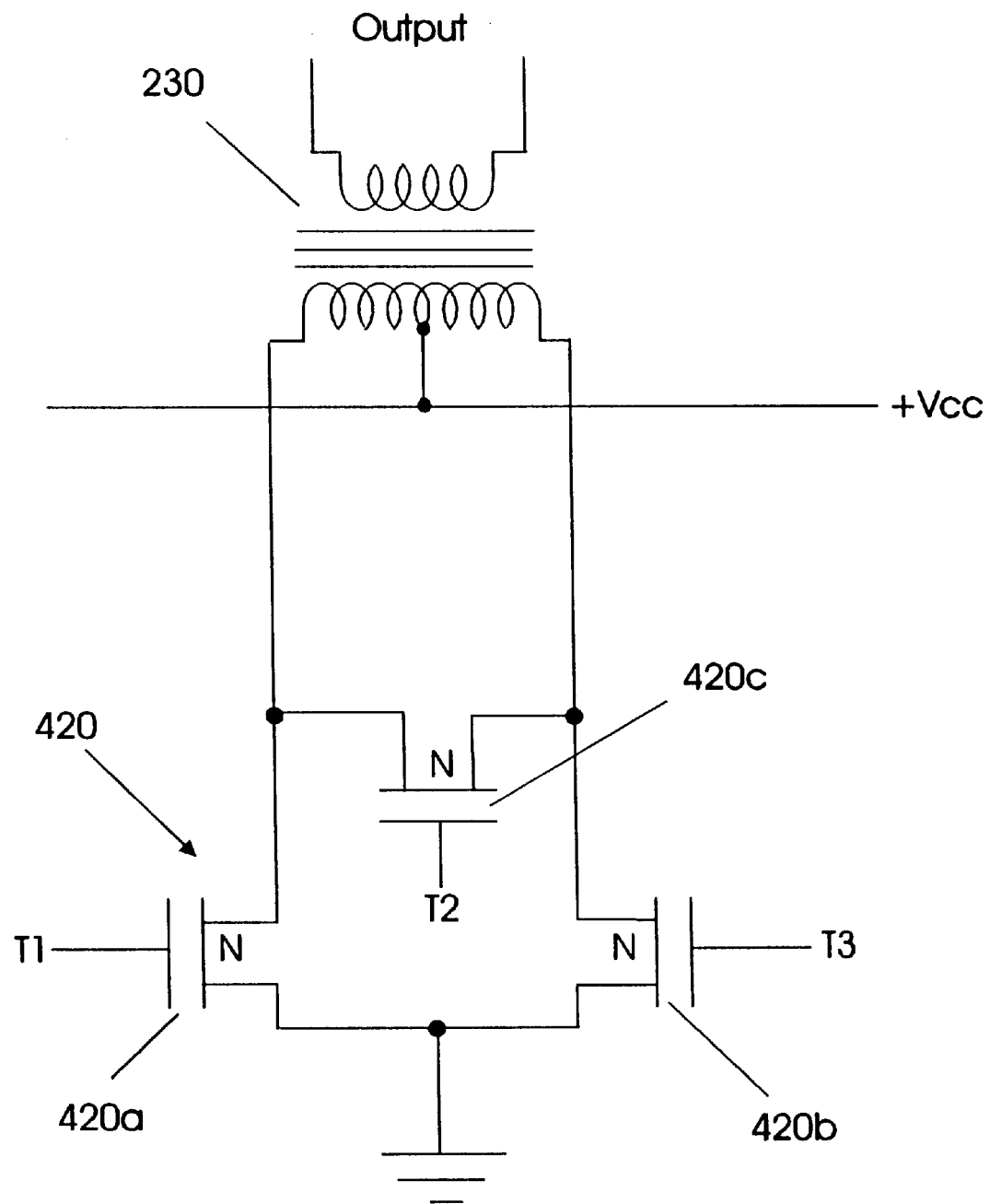
FIG. 4 is a schematic of a ternary synthesis stage according to the present invention.

A ternary bilateral amplifier 420 is shown in FIG. 4. An extra transistor 420c is connected between the ends of the transformer primary 230, compared to FIG. 2. When this extra transistor is turned ON after ensuring that the other two transistors 420a and 420b are OFF, it will short circuit the primary of the transformer 230 ensuring that the voltage contribution to the output is zero; i.e. the third ternary state. The third, shorting transistor 420c should preferably be a completely symmetrical device having the same voltage handling capability and transconductance upon reversal of the roles of source and drain electrodes.

The gate control voltage enabled by the control signal T2 should be greater than $Vcc+V_{threshold}$ in order to turn the device ON, and should be less than $V_{threshold}$ in order to turn the device OFF. The relation between the three control signals T1, T2, T3 and the selected ternary level is shown in the Table below, with a binary "1" indicating that the control voltage is at the ON level and a "0" indicating the OFF level.

TABLE

| LEVEL: | −1 | 0 | +1 |
|---|---|---|---|
| T1 | 1 | 0 | 0 |
| T2 | 0 | 1 | 0 |
| T3 | 0 | 0 | 1 |

Apart from reduction of the number of stages for the same waveform accuracy, ternary systems may also prevent flux build-up in transformers due to slight asymmetries (center tap position for example). In addition, the relative scaling of 3:1 in voltage between successive stages can allow a more rapid reduction in transformer size for the lower significant digits.

A set of ternary control signals T1, T2, T3 may be generated by a ternary A/D converter for an arbitrary signal to be amplified in real time. A ternary A/D converter may comprise a binary A/D converter followed by a binary-to-ternary code converter, which may be a look-up table. For a repetitive waveform, or for a limited number of waveforms such as encountered when modulating a radio signal with digital data streams, sequences of control signals T1, T2, T3 may be precomputed and stored in memory, being recalled from memory in the proper sequence when needed using conventional Read Only Memory modulation generators.

Figure 5:
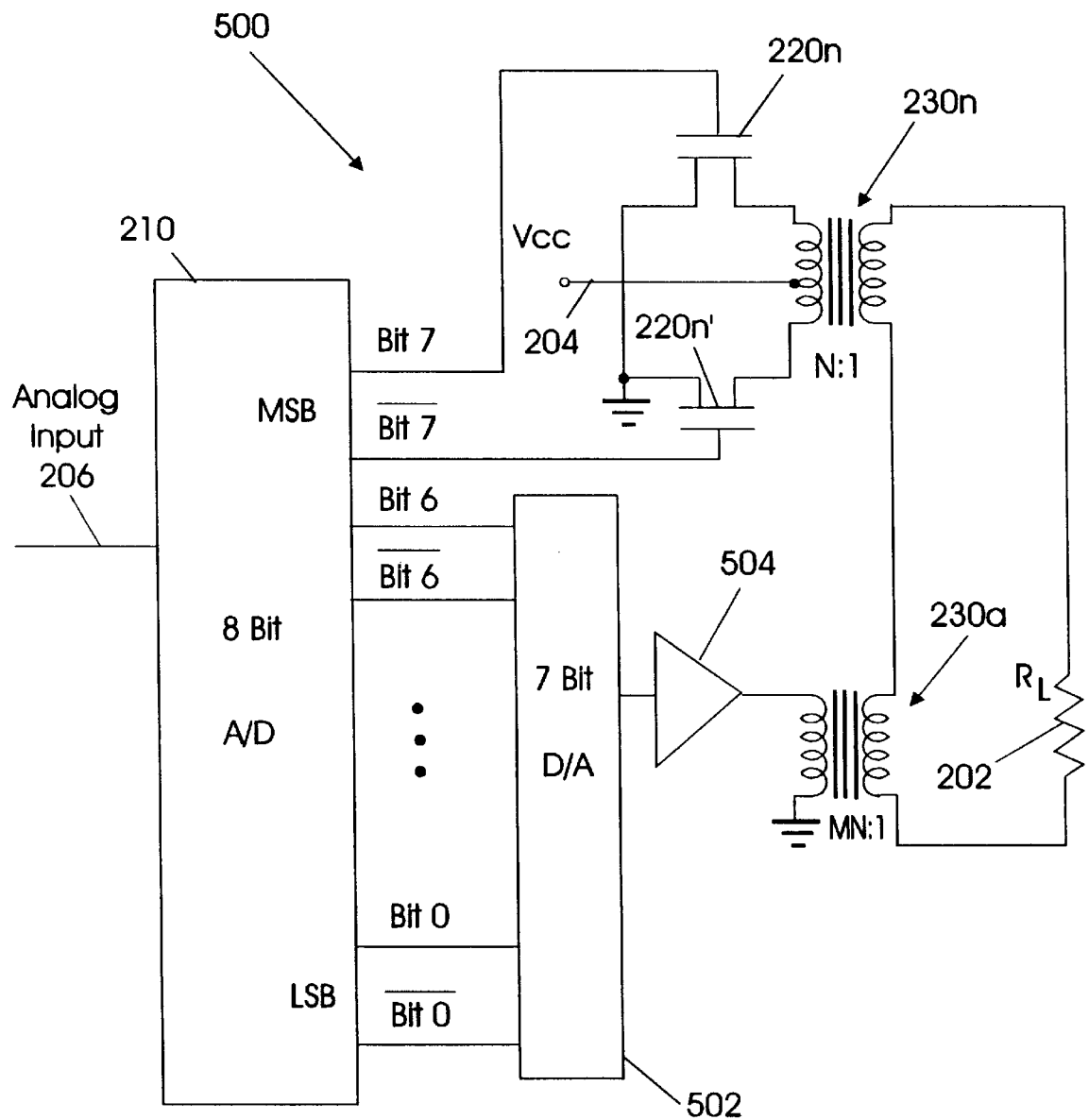
FIG. 5 is a circuit diagram of waveform synthesis using a square wave inverter for the most significant bit and a linear amplifier for the remaining bits, according to the invention.

According to another aspect of the invention, all of the inverters below a given bit significance may be replaced with a linear class-B amplifier or other amplifier that generates the same contribution to the voltage waveform, albeit with lower efficiency. The loss of efficiency may be small if confined to generating the lower significant parts. For example, as shown in FIG. 5, synthesizing apparatus 500 replaces all inverters except for that of greatest bit significance by a class-B amplifier 504 that is coupled to A/D converter 210 by a D/A converter 502. Transformer 230a has a turns ratio of MN:1, where M is the number base of the digital signal representation (e.g. 2 for binary and 3 for ternary). It may be shown that the theoretical efficiency drops from 100% to $\pi/2\sqrt{3}$, which is of the order of 90%. Thus, a trade-off may be made between maximum theoretical efficiency and the number of transformer-coupled stages, i.e. cost.

Many variations may be made by persons skilled in the art, such as, for example, the use of single-ended push-pull amplifiers, having their outputs connected in series with the aid of transformers.

Accordingly, power amplifiers for linearly amplifying a signal waveform include a signal generator for generating a sampled, digital representation of the signal to be amplified, each sample being represented by a numerical code having a number of significant bits from most significant to least significant.

Each bit of the numerical code drives the input of an associated, saturated push-pull amplifier such that the amplifier generates an output of one polarity when the control bit is a binary "1" and an output of the opposite polarity when the control bit is a binary "0". Each amplifier is connected to a prime power source, such as a DC or battery supply. The outputs of the amplifiers are coupled in series with a load into which the amplified signal waveform is to be delivered, such that their respective output voltages are summed in proportion to the significance of their associated code bits and such that the same load current flows in the output terminals of each amplifier.

A preferred series coupling comprises, at the output of each amplifier, a transformer having a primary winding and a secondary winding with turns ratios of N:1, 2N:1, 4N:1 . . . etc., with an increase of two in the ratio for each bit of lower significance.

The amplifiers are constructed using bilateral devices that pass current in either direction when biased to the ON state. When an associated control bit is of such a polarity as to cause the associated amplifier output to subtract from the voltage sum and to thus be of opposite polarity to the direction of load current flow, the current flow in the amplifier devices is reversed, returning energy to the prime power source that is not needed to sustain the load current.

It may be shown that amplifiers according to the invention can have a theoretical efficiency, using ideal bilateral devices, of 100% for any signal waveform, and is thus a better starting point for obtaining practically efficient amplifiers than prior art amplifiers that had less than 100% efficiency even in theory. The invention may be used efficiently to amplify to a transmit power level a radio signal that varies in amplitude as well as phase. Alternatively, the invention may be used as a DC-to-AC converter having a sinusoidal output waveform.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. Apparatus for synthesizing from an input waveform, an output waveform in a load using a DC power supply, the synthesizing apparatus comprising:
    means for representing the input waveform as a sequence of numerical codes in a number base, each numerical code comprising a plurality of digits ordered by place significance;
    a plurality of bilateral amplifying means, a respective one of which is associated with a respective one of the digits, for consuming current from the DC power supply and for returning current to the DC power supply based on the value of the associated digit, to thereby generate an output voltage level that is proportional to the value of the associated digit; and
    means for serially coupling the output voltage levels of the plurality of bilateral amplifying means to the load, with a weighting that is based upon the place significance of the associated digit.

2. Apparatus according to claim wherein the serially coupling means comprises a plurality of transformers, each having a primary and a secondary, the secondaries being serially coupled to the load, a respective primary being coupled to a respective one of the bilateral amplifying means, the primary-to-secondary turns ratios of the plurality of transformers being proportional to the place significance of the associated digit.

3. Apparatus according to claim 1 wherein the bilateral amplifying means are at least one of field effect transistors that conduct from source to drain and from drain to source, and bipolar transistors including reverse conduction diodes that conduct in a forward direction through the bipolar transistor and in the reverse direction through the reverse conduction diodes.

4. Apparatus according to claim 1 wherein the input waveform is a DC input waveform, to provide a DC to AC power converter.

5. Apparatus according to claim 3 wherein the output waveform is an approximately sinusoidal output waveform.

6. Apparatus according to claim 1 wherein the number base is binary and wherein the plurality of bilateral amplifying means comprises a plurality of square wave inverters.

7. Apparatus according to claim 1 wherein the number base is ternary and wherein the plurality of bilateral amplifying means comprises a plurality of square wave inverters with zero clamping to generate positive, zero and negative output voltage levels.

8. Apparatus according to claim 1 further comprising at least one linear amplifier that is associated with at least two of the least significant digits to generate a linear output voltage that is proportional to the combined values of the at least two least significant digits, the serially coupling means also serially coupling the linear output voltage to the load.

9. Apparatus for synthesizing from an input waveform, an output waveform in a load using a DC power supply, the synthesizing apparatus comprising:

a numerical code generator that represents the input waveform as a sequence of numerical codes in a number base, each numerical code comprising a plurality of digits ordered by place significance; and a plurality of bilateral amplifiers, a respective one of which is associated with a respective one of the digits, the bilateral amplifiers consuming current from the DC power supply and returning current to the DC power supply based on the value of the associated digit, to thereby generate an output voltage level that is proportional to the value of the associated digit, the output voltage levels of the plurality of bilateral amplifiers being serially coupled to the load, with a weighting that is based upon the place significance of the associated digit.

10. Apparatus according to claim 9 further comprising a plurality of transformers, each having a primary and a secondary, the secondaries being serially coupled to the load, a respective primary being coupled to a respective one of the bilateral amplifiers, the primary-to-secondary turns ratios of the plurality of transformers being proportional to the place significance of the associated digit.

11. Apparatus according to claim 9 wherein the bilateral amplifiers are at least one of field effect transistors that conduct from source to drain and from drain to source, and bipolar transistors including reverse conduction diodes that conduct in a forward direction through the bipolar transistor and in the reverse direction through the reverse conduction diodes.

12. Apparatus according to claim 9 wherein the input waveform is a DC input waveform, to provide a DC to AC power converter.

13. Apparatus according to claim 11 wherein the output waveform is an approximately sinusoidal output waveform.

14. Apparatus according to claim 9 wherein the number base is binary and wherein the plurality of bilateral amplifiers comprise a plurality of square wave inverters.

15. Apparatus according to claim 9 wherein the number base is ternary and wherein the plurality of bilateral amplifiers comprise a plurality of square wave inverters with zero clamping to generate positive, zero and negative output voltage levels.

16. Apparatus according to claim 9 further comprising at least one linear amplifier that is associated with at least two of the least significant digits to generate a linear output voltage that is proportional to the combined values of the at least two least significant digits, the linear output voltage also being serially coupled to the load.

17. A method for synthesizing from an input waveform, an output waveform in a load using a DC power supply, the synthesizing method comprising the steps of:

representing the input waveform as a sequence of numerical codes in a number base, each numerical code comprising a plurality of digits ordered by place significance;

bilaterally amplifying the value of each of the digits, to consume current from the DC power supply and return current to the DC power supply based on the value of the associated digit, and thereby generate a plurality of output voltage levels each of which is proportional to the value of the associated digit; and serially coupling the plurality of output voltage levels to the load, with a weighting that is based upon the place significance of the associated digit.

18. A method according to claim 17 wherein the input waveform is a DC input waveform, to provide a DC to AC power converting method.

19. A method according to claim 17 wherein the output waveform is an approximately sinusoidal output waveform.

20. A method according to claim 17 further comprising the step of:

linearly amplifying at least two of the least significant digits to generate a linear output voltage that is proportional to the combined values of the at least two least significant digits; and serially coupling the linear output voltage to the load.

* * * * *